US012633959B2

(12) United States Patent
North et al.

(10) Patent No.: US 12,633,959 B2
(45) Date of Patent: May 19, 2026

(54) DIGITAL ISOLATOR ARCHITECTURE FOR HYBRID CAPACITOR AND INDUCTOR

(71) Applicant: Kinetic Technologies International Holdings LP, Toronto (CA)

(72) Inventors: Brian North, San Jose, CA (US); Siddharth Dutta, San Jose, CA (US)

(73) Assignee: Kinetic Technologies International Holdings LP, Toronto (CA)

( * ) Notice: Subject to any disclaimer, the term of this patent is extended or adjusted under 35 U.S.C. 154(b) by 0 days.

(21) Appl. No.: 18/778,583

(22) Filed: Jul. 19, 2024

(65) Prior Publication Data

US 2024/0372577 A1     Nov. 7, 2024

Related U.S. Application Data

(63) Continuation of application No. PCT/CA2023/050062, filed on Jan. 20, 2023.

(60) Provisional application No. 63/301,719, filed on Jan. 21, 2022.

(51) Int. Cl.
| | |
|---|---|
| *H04B 1/40* | (2015.01) |
| *H03B 5/08* | (2006.01) |
| *H04L 25/02* | (2006.01) |

(52) U.S. Cl.
CPC ................. *H04B 1/40* (2013.01); *H03B 5/08* (2013.01); *H04L 25/0266* (2013.01)

(58) Field of Classification Search
CPC ... H04B 1/38; H04B 1/40; H04B 5/22; H04B 5/24; H04B 5/75; H04L 25/026; H04L 25/0266; H04L 25/0276; H03B 5/08; H03F 2200/276

USPC ........ 375/219, 220, 257, 258; 370/282, 284; 455/70, 500
See application file for complete search history.

(56) References Cited

U.S. PATENT DOCUMENTS

| | | | |
|---|---|---|---|
| 9,287,825 B2 | 3/2016 | Atesoglu | |
| 9,978,511 B2 | 5/2018 | Spina et al. | |
| 10,965,382 B1 | 3/2021 | Shrivastava | |
| 2009/0213914 A1* | 8/2009 | Dong ........................ | H04L 5/14 |
| | | | 375/219 |
| 2011/0115566 A1 | 5/2011 | Moon et al. | |
| 2012/0326773 A1 | 12/2012 | Posat et al. | |
| 2014/0273883 A1* | 9/2014 | Chakraborty ........ | H03G 3/3042 |
| | | | 455/73 |
| 2016/0072442 A1 | 3/2016 | Testi et al. | |
| 2017/0288650 A1 | 10/2017 | Yang et al. | |
| 2018/0226920 A1 | 8/2018 | Mukherjee et al. | |

(Continued)

FOREIGN PATENT DOCUMENTS

WO     2013/086445 A1     6/2013

OTHER PUBLICATIONS

PCT International Search Report and the Written Opinion mailed Apr. 15, 2023, issued in related International Application No. PCT/CA2023/050062 (8 pages).

(Continued)

*Primary Examiner* — Young T. Tse
(74) *Attorney, Agent, or Firm* — Sheppard Mullin Richter & Hampton LLP

(57) ABSTRACT

In general, one aspect disclosed features an apparatus comprising: a receiver comprising a receiver inductor-capacitor (LC) tank; a transmitter comprising an oscillator; and a capacitive isolation barrier electrically coupled between an output of the transmitter and an input of the receiver.

13 Claims, 7 Drawing Sheets

(56)                   References Cited

U.S. PATENT DOCUMENTS

| | | | |
|---|---|---|---|
| 2018/0278229 A1* | 9/2018 | Sankaran | ................. H03H 7/03 |
| 2020/0119689 A1 | 4/2020 | Singh et al. | |
| 2022/0014016 A1 | 1/2022 | Jin | |
| 2022/0385258 A1* | 12/2022 | Zhan | .................... H03H 7/0115 |

OTHER PUBLICATIONS

Search Report dated Jun. 11, 2024, issued in related Taiwan Application No. 112102548 (2 pages).

* cited by examiner

TX IN

Carrier Signal CS

RX OUT

DIGITAL ISOLATOR ARCHITECTURE FOR HYBRID CAPACITOR AND INDUCTOR

CROSS REFERENCE TO RELATED APPLICATIONS

This application is a continuation application of International Patent Application No. PCT/CA2023/050062, filed on Jan. 20, 2023, which is based on and claims priority to U.S. Provisional Patent Application No. 63/301,719, filed Jan. 21, 2022, entitled "DIGITAL ISOLATOR ARCHITECTURE FOR HYBRID CAPACITOR AND INDUCTOR." The disclosure of all of the above applications is incorporated by reference herein in their entirety.

DESCRIPTION OF RELATED ART

The disclosed technology relates generally to electronic data communications, and more particularly some embodiments are related to electronic data communications across a galvanic isolation barrier.

SUMMARY

In general, one aspect disclosed features an apparatus comprising: a receiver comprising a receiver inductor-capacitor (LC) tank; a transmitter comprising an oscillator; and a capacitive isolation barrier electrically coupled between an output of the transmitter and an input of the receiver.

Embodiments of the apparatus may include one or more of the following features. In some embodiments, the oscillator is tuned to a resonant frequency of the LC tank. In some embodiments, the receiver LC tank comprises: a receiver coupled inductor pair with a center tap. In some embodiments, the inductor pair is implemented using standard complementary metal oxide semiconductor (CMOS) processes. In some embodiments, the transmitter transmits a signal of interest; and the receiver coupled inductor pair with a center tap is configured to cancel any common mode signal without attenuating the signal of interest.

In some embodiments, the receiver comprises a differential receive amplifier. In some embodiments, the receiver coupled inductor pair with the center tap is electrically coupled between differential inputs of the differential receive amplifier. In some embodiments, the capacitive isolation barrier comprises: a first capacitor electrically coupled to a first input of the differential receive amplifier; and a second capacitor electrically coupled to a second input of the differential receive amplifier. Some embodiments comprise a first tunable capacitor coupled to a first differential input of the differential receive amplifier; and a second tunable capacitor coupled to a second differential input of the differential receive amplifier In some embodiments, the transmitter comprises a differential transmit driver. In some embodiments, the oscillator is electrically coupled between an input of the transmitter and inputs of the differential transmit driver. In some embodiments, the oscillator is electrically coupled to a first input of the differential transmit driver by a first capacitor; and the oscillator is electrically coupled to a second input of the differential transmit driver by a second capacitor. In some embodiments, the capacitive isolation barrier comprises: a first capacitor electrically coupled to a first output of the differential transmit driver; and a second capacitor electrically coupled to a second output of the differential transmit driver In some embodiments, the transmitter further comprises a transmitter LC tank, wherein the transmitter LC tank is tuned to the resonant frequency of the receiver LC tank. In some embodiments, the transmitter LC tank comprises a transmitter coupled inductor pair with a second center tap separate from the receiver LC tank. In some embodiments, the inductor pair is implemented using standard CMOS processes. In some embodiments, the transmitter comprises a differential transmit driver; and the transmitter coupled inductor pair with the second center tap is electrically coupled between differential outputs of the differential transmit driver. In some embodiments, a first tunable capacitor coupled to a first differential output of the differential transmit driver; and a second tunable capacitor coupled to a second differential output of the differential transmit driver.

In some embodiments, the transmitter and receiver employ on-off keying communications by modulating a carrier available at the transmitter. Some embodiments comprise a second receiver comprising a second receiver LC tank; a second transmitter comprising a second oscillator, wherein the second oscillator is tuned to a resonant frequency of the second receiver LC tank, and wherein the resonant frequency of the second receiver LC tank is different from the resonant frequency of the transmitter LC tank; and a second capacitive isolation barrier electrically coupled between an output of the second transmitter and an input of the second receiver.

BRIEF DESCRIPTION OF THE DRAWINGS

The present disclosure, in accordance with one or more various embodiments, is described in detail with reference to the following figures. The figures are provided for purposes of illustration only and merely depict typical or example embodiments.

The figures are not exhaustive and do not limit the present disclosure to the precise form disclosed.

DETAILED DESCRIPTION

Figure 1:
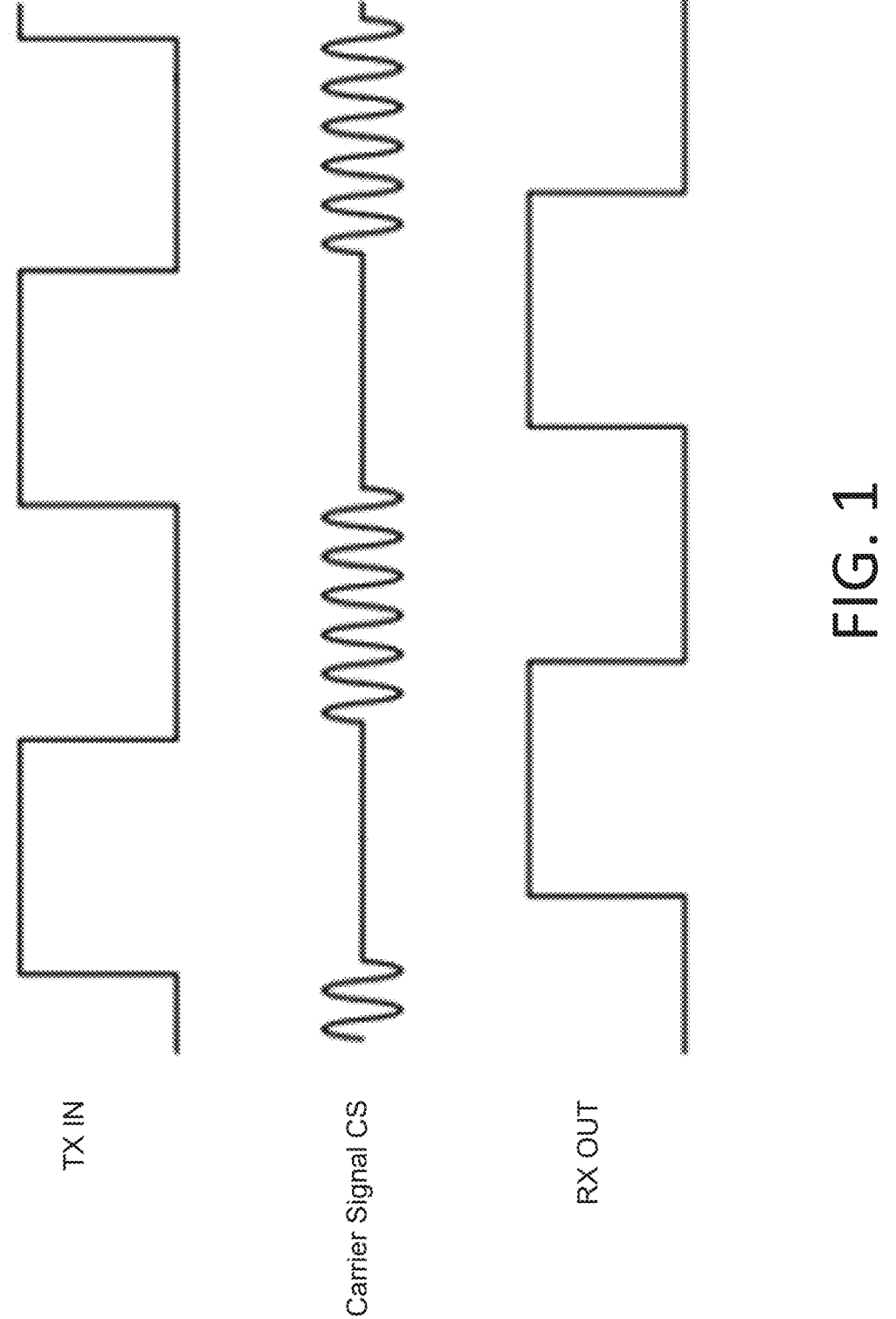
FIG. 1 illustrates on-off keying (OOK) of a carrier signal to exchange the information across a galvanic isolation barrier.

In many applications such as industrial, automotive, renewable energy, and medical equipment, there is a need to provide galvanic isolation between two electrical domains while exchanging information between the electrical domains. These approaches generally employ on-off keying (OOK) of a carrier signal to exchange the information across a galvanic isolation barrier. OOK signals are illustrated in FIG. 1, where an input signal TX IN and the corresponding output signal RX OUT are square waves. The input signal TX IN OOK modulates a carrier signal CS for transmission across the galvanic isolation barrier. The presence of the carrier signal CS indicates the "off" state of the OOK signal, while the absence of the carrier signal CS indicates the "on" state. The carrier signal CS is then OOK demodulated on the other side of the galvanic isolation barrier to produce the output signal RX OUT.

In one approach, optocouplers have been used to achieve such isolation where a signal is generated by modulating a light emitting transmitter on one side of the galvanic barrier, and receiving the signal in the form of light using a photo receiver on the other side of the galvanic barrier.

In recent years these devices have been replaced by silicon based isolators that use a transmitter device and a receiver device implemented on two separate silicon chips that are galvanically isolated. One of the key requirements of these solutions is to tolerate large DC and transient voltage differences between the transmitter and receiver chips. In particular, even if there is a large common mode voltage change between the two chips (transmitter and receiver), on the order of 10 KV/us to 100 KV/us, no signal corruption should occur. This is a key metric for digital isolators, and is commonly referred to as "Common Mode Transient Immunity" (CMTI). There are currently two main methods of achieving signal transmission across the galvanic barrier: inductive and capacitive.

Figure 2:
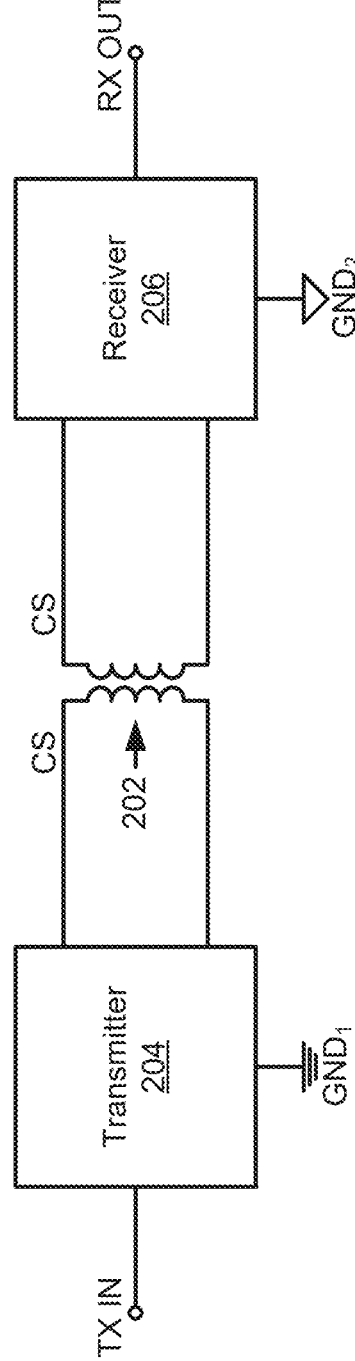
FIG. 2. illustrates an inductive approach for transmitting signals across the galvanic barrier.

FIG. 2. illustrates an inductive approach for transmitting signals across the galvanic barrier. Referring to FIG. 2, the primary side of a transformer 202 is connected to a transmitter 204, while the secondary side of the transformer 202 is connected to a receiver 206. The coupling between the transformer primary and secondary is used to sense the primary signal on the secondary side and thus achieve signal communication.

However, this implementation is area and power intensive due to the requirements of implementing and driving the transformer 202 on silicon. This method also requires specialized processing and assembly to achieve good performance. Such solutions have primarily been adopted by silicon vendors with their own captive foundry and assembly operations.

Figure 3:
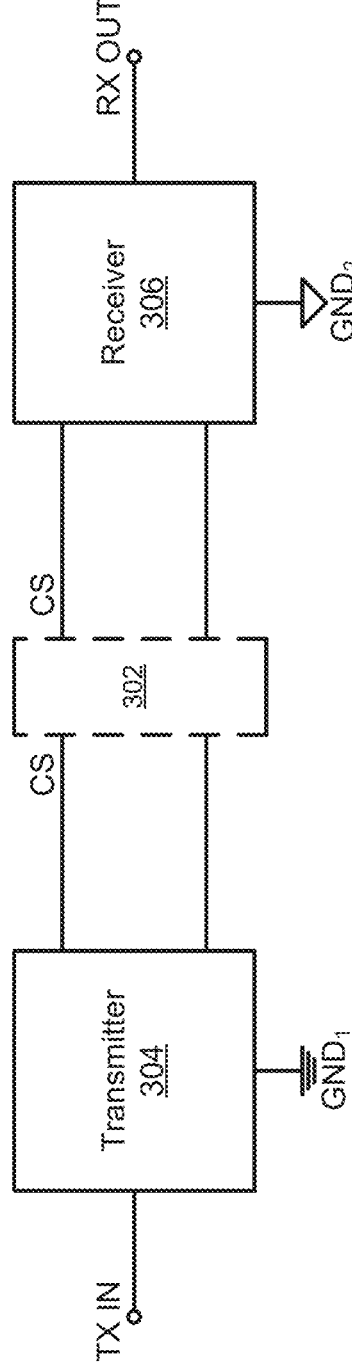
FIG. 3. illustrates a capacitive approach for transmitting signals across the galvanic barrier.

FIG. 3. illustrates a capacitive approach for transmitting signals across the galvanic barrier. Referring to FIG. 3, a capacitive isolation barrier 302 is connected in series between a transmitter 304 and a receiver 306. This is currently the most common implementation of silicon based isolators, but has several drawbacks. This implementation is sensitive to parasitic capacitance to ground on both the receiver chip and the transmitter chip. CMTI performance is limited by the ratio of coupling capacitance to parasitic capacitance.

The capacitive coupling between transmitter 304 and receiver 306 attenuates the signal of interest and the common mode noise signal by the same factor. Since the common mode signal during a CMTI event is of the order of 10 KV to 100 KV and the signal of interest of the order of 1V, this further limits the CMTI performance of such solutions.

Robust signal detection requires modulation of the signal at the transmit side and demodulation of the signal at the receive side. To avoid the signal of interest being corrupted by the much larger common mode signal during a-common mode transient event, the demodulation requires more time and sometimes additional circuits to reject the common mode signal. This increases signal latency and is a still further limitation on performance.

Figure 4:
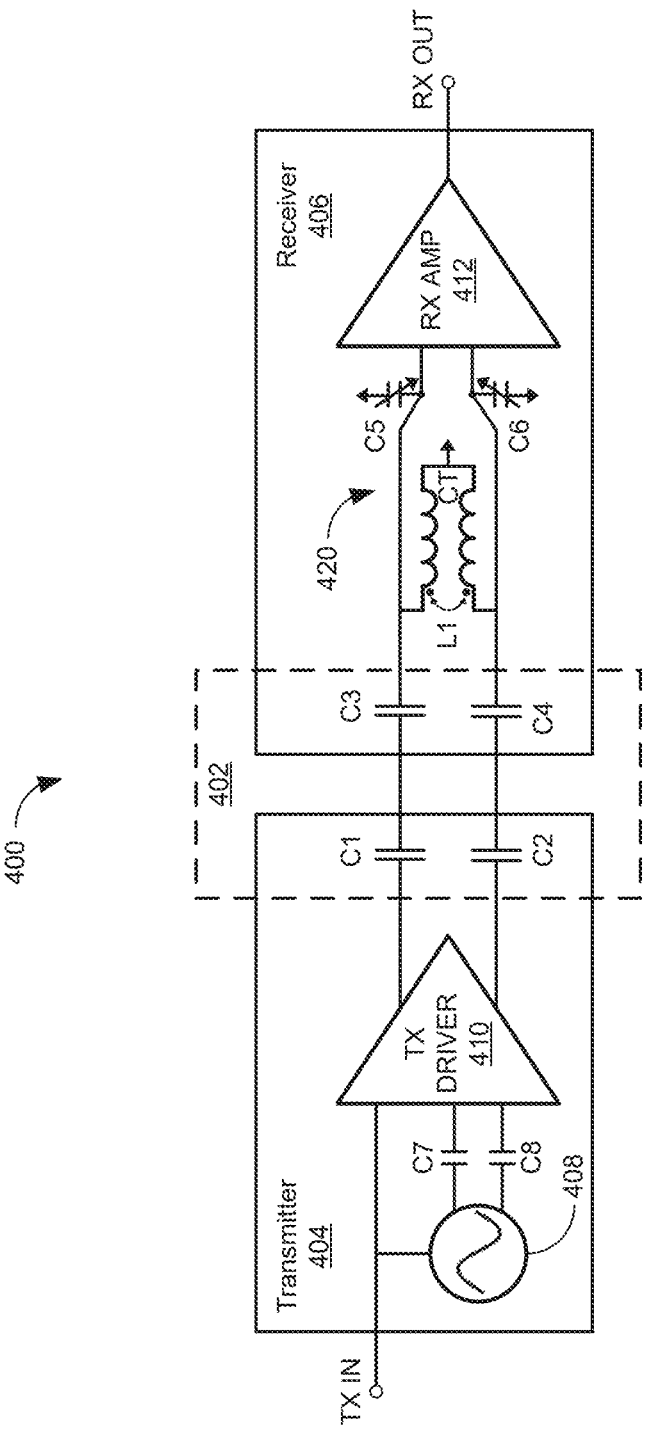
FIG. 4. is a circuit block diagram of a hybrid capacitor and inductor based digital isolator circuit according to some embodiments of the disclosed technologies.

FIG. 4. is a circuit block diagram of a hybrid capacitor and inductor based digital isolator circuit 400 according to some embodiments of the disclosed technologies. Referring to FIG. 4, the circuit 400 includes a capacitive isolation barrier 402 connected in series between a transmitter 404 and a receiver 406. The transmitter 404 may include a tunable oscillator 408 and a transmit (TX) driver 410, both coupled to an input signal TX IN. The transmit driver 410 may be differential, and the oscillator 408 may be coupled to differential inputs of the differential TX driver 410, for example by capacitors C7 and C8. The transmitter 404 may include output capacitors C1 and C2.

The receiver 406 may include an LC tank 420 and a receive (RX) amplifier 412 that provides an output signal RX OUT. The receiver 406 may include input capacitors C3 and C4. The receive amplifier 412 may be differential. The LC tank 420 may include an inductor L1 coupled between the differential inputs of the receive amplifier 412. The inductor L1 may be a paired inductor with a center tap CT. The LC tank 420 may include two tunable capacitors C5 and C6, each coupled to one of the differential inputs of the receiver amplifier 412.

The oscillator 408 may be factory tuned to the resonant frequency of the LC tank 420. The differential signal of interest may be amplified by the LC tank 420. The paired inductors in the LC tank 420 may be coupled in a way that cancels the common mode signal passing through them without attenuating the differential mode signal of interest. This results in an attenuation of the undesirable common mode transient signal compared to the differential signal of interest. The combination of these features may fundamentally improve the signal to noise ratio between the differential signal of interest and the common mode signal to be rejected, thus fundamentally improving achievable CMTI. For perfect coupling of the inductors, the common mode signal will be reduced to zero without any impact on the differential signal. Because the circuit 400 cancels the common mode transient signal, there is no need to allocate additional time or circuits to reject the common mode signal. This improves latency. The inductors L1 are not very sensitive to losses and can be implemented using standard CMOS processes. This allows the use of commercially available third party silicon foundry processes and standard assembly techniques to implement such chips. The hybrid capacitor and inductor based digital isolator circuit 400 of FIG. 4 achieves both a high CMTI and low latency at the same time.

Figure 5:
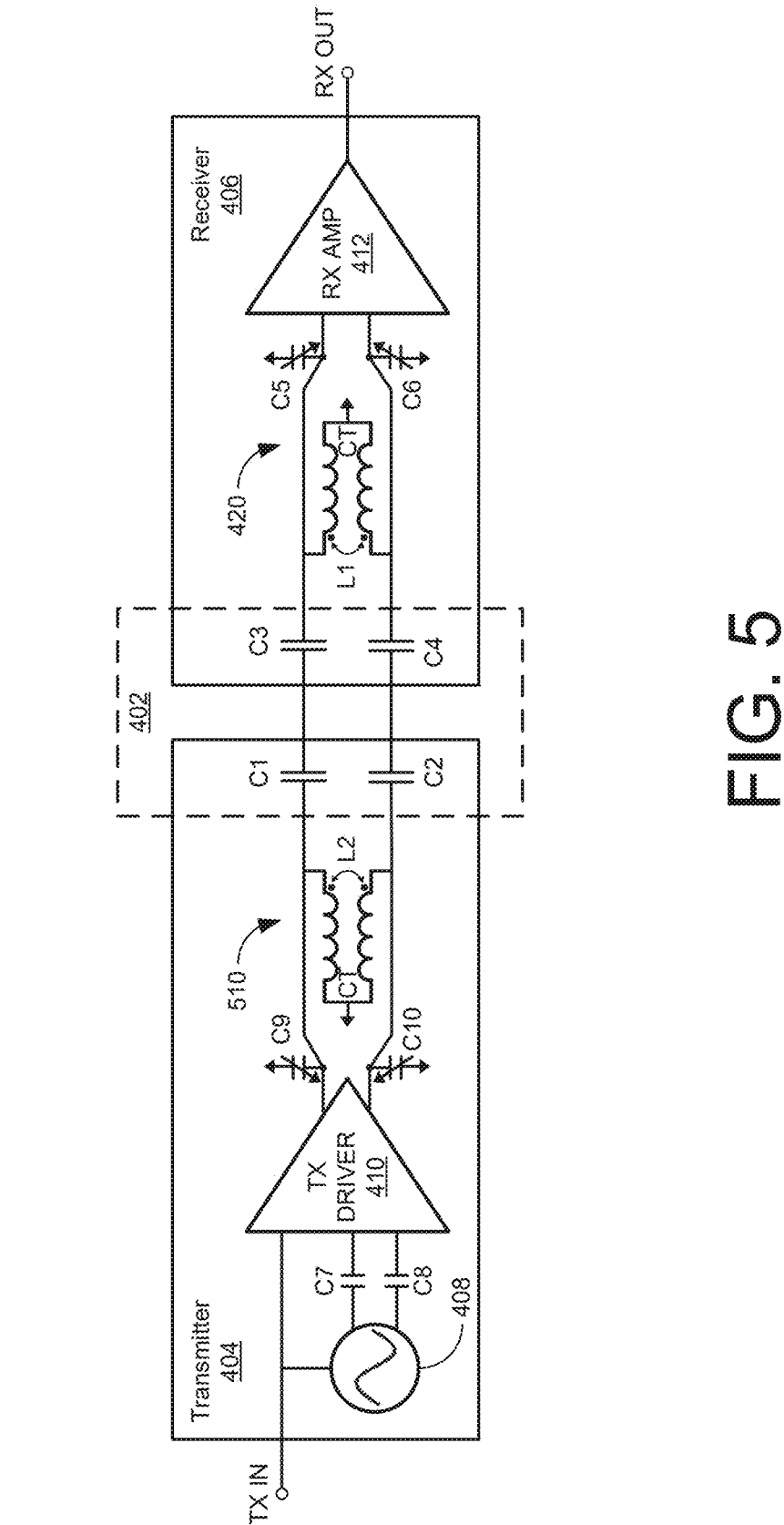
FIG. 5 is a circuit block diagram of a hybrid capacitor and inductor based digital isolator circuit having LC tanks in both the transmitter and the receiver according to some embodiments of the disclosed technologies.

In some embodiments, an additional LC tank may be implemented in the transmitter 404. FIG. 5 is a circuit block diagram of a hybrid capacitor and inductor based digital isolator circuit 500 having LC tanks in both the transmitter and the receiver according to some embodiments of the disclosed technologies. Referring to FIG. 5, the circuit 500 is similar to the circuit 400, but with the addition of an LC tank 510 to the transmitter 404. The LC tank 510 may include an inductor L2 coupled between the differential outputs of the transmit driver 420. The inductor L2 may be a paired inductor with a center tap CT. The LC tank 420 may include two tunable capacitors C9 and C10, each coupled to one of the differential outputs of the transmit driver 420. The second LC tank 510 may be tuned to the resonant frequency of the first LC tank 420. This arrangement may further improve CMTI by another factor of two.

Figure 6:
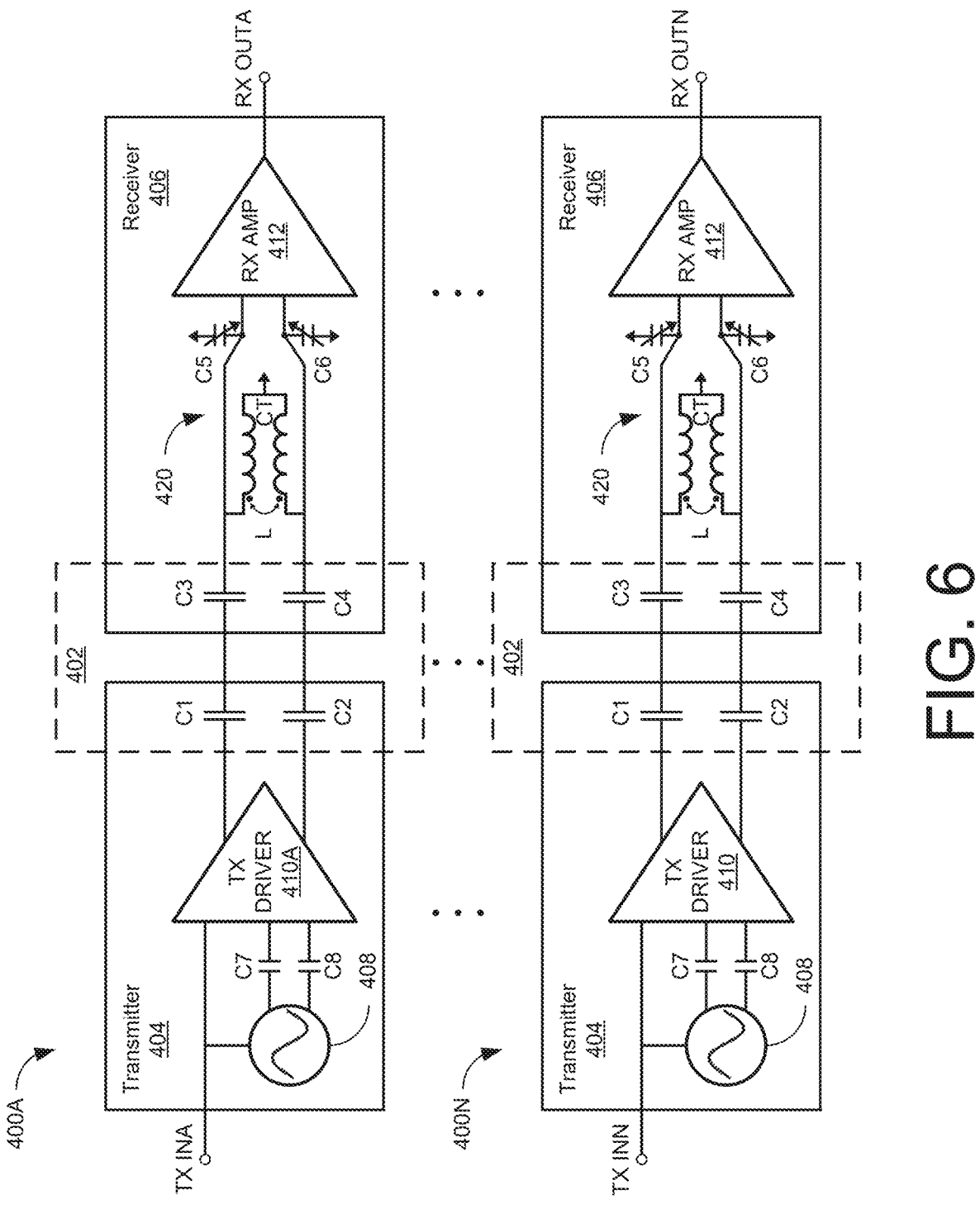
FIG. 6 depicts a multi-channel hybrid capacitor and inductor based digital isolator circuit that includes a plurality of the disclosed hybrid capacitor and inductor based digital isolator circuits according to some embodiments of the disclosed technologies.

In some embodiments, a multi-channel hybrid capacitor and inductor based digital isolator circuit includes a plurality of the disclosed hybrid capacitor and inductor based digital isolator circuits. FIG. 6 depicts one such circuit 600 according to some embodiments of the disclosed technologies. Referring to FIG. 6, the circuit 600 includes N isolator circuits 400A-400N. Each of the isolator circuits 400A-400N may implemented as described with reference to FIG. 4. In some embodiments, each of the isolator circuits 400A-400N may implemented as described with reference to FIG. 5. Each of the isolator circuits 400A-400N may be tuned to a different frequency to increase immunity from crosstalk between the channels. In some embodiments, one or more of the isolator circuits 400A-400N may share an oscillator.

Figure 7:
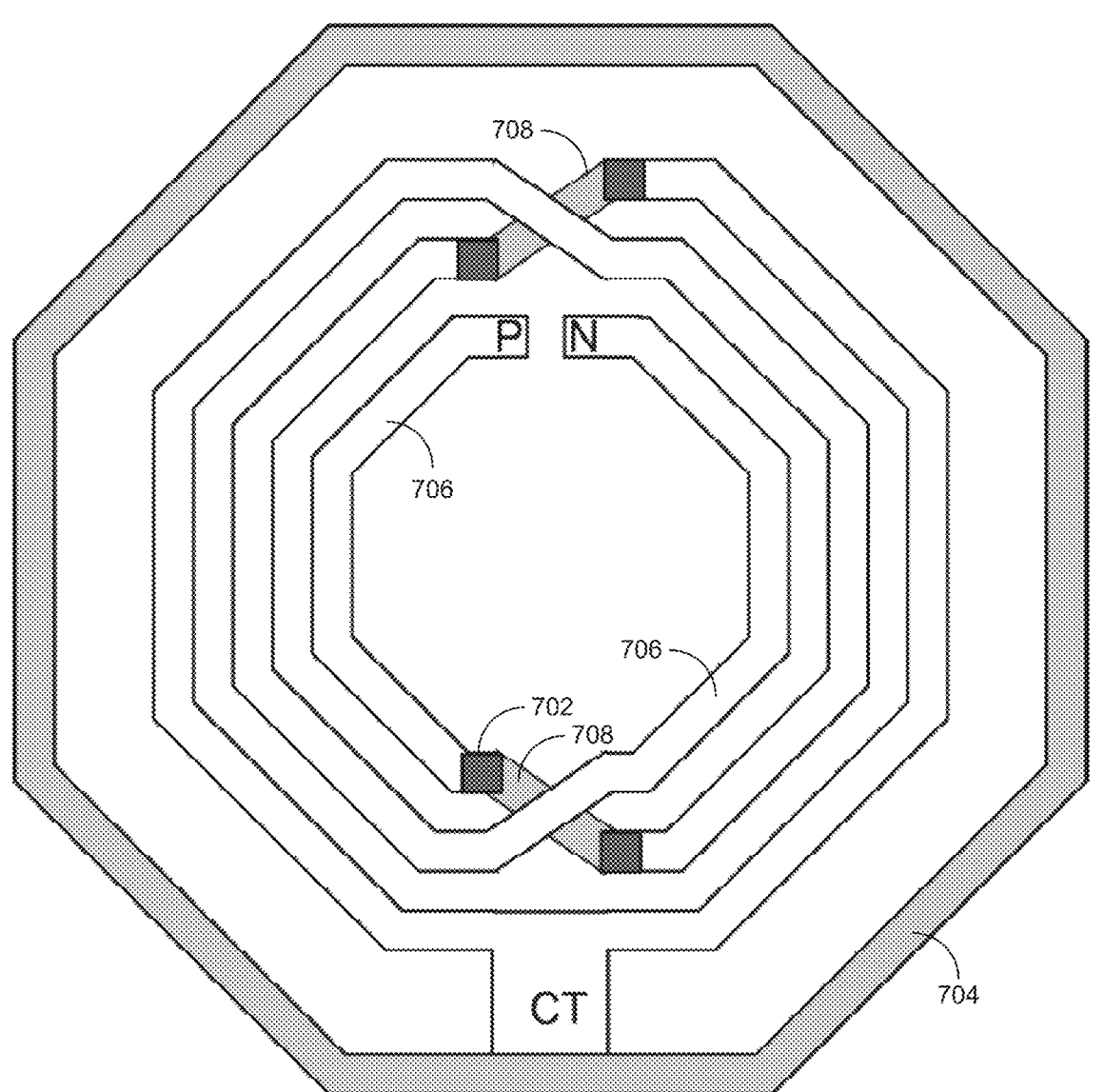
FIG. 7 illustrates a paired inductor with a center tap according to some embodiments of the disclosed technologies.

FIG. 7 illustrates a paired inductor with a center tap according to some embodiments of the disclosed technologies. Referring to FIG. 7, the inductor may include two traces that connect a pair of inputs P and N to a common tap CT. Each trace may include top metal layers 706, and top-1 metal layers 708. The top metal layers 706 in a trace may be connected to the top-1 layers 708 in that trace by a plurality of vias 702. The inductor may be surrounded by metal structures 704 that reduce the magnetic coupling of the inductor to adjacent electrical structures.

As used herein, a circuit might be implemented utilizing any form of hardware, or a combination of hardware and software. For example, one or more processors, controllers, ASICs, PLAS, PALs, CPLDs, FPGAs, logical components, software routines or other mechanisms might be implemented to make up a circuit. In implementation, the various circuits described herein might be implemented as discrete circuits or the functions and features described can be shared in part or in total among one or more circuits. Even though various features or elements of functionality may be individually described or claimed as separate circuits, these features and functionality can be shared among one or more common circuits, and such description shall not require or imply that separate circuits are required to implement such features or functionality.

As used herein, the term "or" may be construed in either an inclusive or exclusive sense. Moreover, the description of resources, operations, or structures in the singular shall not be read to exclude the plural. Conditional language, such as, among others, "can," "could," "might," or "may," unless specifically stated otherwise, or otherwise understood within the context as used, is generally intended to convey that certain embodiments include, while other embodiments do not include, certain features, elements and/or steps.

Terms and phrases used in this document, and variations thereof, unless otherwise expressly stated, should be construed as open ended as opposed to limiting. Adjectives such as "conventional," "traditional," "normal," "standard," "known," and terms of similar meaning should not be construed as limiting the item described to a given time period or to an item available as of a given time, but instead should be read to encompass conventional, traditional, normal, or standard technologies that may be available or known now or at any time in the future. The presence of broadening words and phrases such as "one or more," "at least," "but not limited to" or other like phrases in some instances shall not be read to mean that the narrower case is intended or required in instances where such broadening phrases may be absent.

The foregoing description of the present disclosure has been provided for the purposes of illustration and description. It is not intended to be exhaustive or to limit the disclosure to the precise forms disclosed. The breadth and scope of the present disclosure should not be limited by any of the above-described exemplary embodiments. Many modifications and variations will be apparent to the practitioner skilled in the art. The modifications and variations include any relevant combination of the disclosed features. The embodiments were chosen and described in order to best explain the principles of the disclosure and its practical application, thereby enabling others skilled in the art to understand the disclosure for various embodiments and with various modifications that are suited to the particular use contemplated. It is intended that the scope of the disclosure be defined by the following claims and their equivalence.

What is claimed is:

1. An apparatus comprising:
a receiver comprising a receiver inductor-capacitor (LC) tank and a differential receive amplifier;
a transmitter comprising an oscillator and a differential transmit driver; and
a capacitive isolation barrier electrically coupled between an output of the transmitter and an input of the receiver, wherein:
the oscillator is electrically coupled to a first input of the differential transmit driver by a first capacitor;
the oscillator is electrically coupled to a second input of the differential transmit driver by a second capacitor;
the receiver LC tank comprises a coupled inductor pair having a center tap and one or more capacitors, the coupled inductor pair being electrically coupled between differential inputs of the differential receive amplifier; and
the coupled inductor pair is configured to cancel a common mode transient signal passing through the receiver LC tank without attenuating a differential signal of interest at a resonant frequency of the receiver LC tank.

2. The apparatus of claim 1, wherein:
the oscillator is tuned to the resonant frequency of the receiver LC tank.

3. The apparatus of claim 1, wherein the coupled inductor pair is implemented using standard complementary metal oxide semiconductor (CMOS) processes.

4. The apparatus of claim 1, wherein the capacitive isolation barrier comprises:
a first capacitor electrically coupled to a first input of the differential receive amplifier; and
a second capacitor electrically coupled to a second input of the differential receive amplifier.

5. The apparatus of claim 1, the one or more capacitors comprising:
a first tunable capacitor coupled to a first differential input of the differential receive amplifier; and
a second tunable capacitor coupled to a second differential input of the differential receive amplifier.

6. The apparatus of claim 1, wherein:
the oscillator is electrically coupled between an input of the transmitter and the first and second inputs of the differential transmit driver.

7. The apparatus of claim 1, wherein the capacitive isolation barrier comprises:
a first capacitor electrically coupled to a first output of the differential transmit driver; and
a second capacitor electrically coupled to a second output of the differential transmit driver.

8. The apparatus of claim 1, wherein:
the transmitter further comprises a transmitter LC tank, wherein the transmitter LC tank is tuned to the resonant frequency of the receiver LC tank.

9. The apparatus of claim 8, wherein:

the transmitter LC tank comprises a transmitter coupled inductor pair with a second center tap separate from the receiver LC tank.

10. The apparatus of claim 9, wherein the transmitter coupled inductor pair is implemented using standard complementary metal oxide semiconductor (CMOS) processes.

11. The apparatus of claim 8, further comprising:

a second receiver comprising a second receiver LC tank;

a second transmitter comprising a second oscillator, wherein the second oscillator is tuned to a resonant frequency of the second receiver LC tank, and wherein the resonant frequency of the second receiver LC tank is different from a resonant frequency of the transmitter LC tank; and a second capacitive isolation barrier electrically coupled between an output of the second transmitter and an input of the second receiver.

12. The apparatus of claim 1, the transmitter further comprising:

a first tunable capacitor coupled to a first differential output of the differential transmit driver; and a second tunable capacitor coupled to a second differential output of the differential transmit driver.

13. The apparatus of claim 1, wherein:

the transmitter is configured to employ on-off keying communications by modulating a carrier signal available at the transmitter; and the receiver is configured to demodulate the modulated carrier signal of the on-off keying communications.

* * * * *